(12) United States Patent
Bittlestone et al.

(10) Patent No.: US 7,973,557 B2
(45) Date of Patent: Jul. 5, 2011

(54) IC HAVING PROGRAMMABLE DIGITAL LOGIC CELLS

(75) Inventors: Clive D. Bittlestone, Allen, TX (US); Kit Wing S. Lee, McKinney, TX (US); Ekanayake A. Amerasekera, Dallas, TX (US); Anuj Batra, Dallas, TX (US); Srinivas Lingam, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/433,169

(22) Filed: Apr. 30, 2009

(65) Prior Publication Data

US 2009/0273367 A1 Nov. 5, 2009

Related U.S. Application Data

(60) Provisional application No. 61/050,059, filed on May 2, 2008.

(51) Int. Cl.
*H03K 19/173* (2006.01)

(52) U.S. Cl. ............ 326/38; 326/41; 327/530; 327/534; 327/537

(58) Field of Classification Search .................. 326/82, 326/83, 81; 327/525, 387
See application file for complete search history.

(56) References Cited

U.S. PATENT DOCUMENTS

| | | | |
|---|---|---|---|
| 4,896,296 A | 1/1990 | Turner et al. | |
| 5,059,835 A | 10/1991 | Lauffer et al. | |
| 5,099,149 A | 3/1992 | Smith | |
| 5,801,548 A | 9/1998 | Lee et al. | |
| 5,847,993 A | 12/1998 | Dejenfelt | |
| 6,064,223 A * | 5/2000 | Lu et al. | 326/21 |
| 6,118,302 A * | 9/2000 | Turner et al. | 326/68 |
| 6,147,508 A * | 11/2000 | Beck et al. | 326/32 |
| 6,147,513 A * | 11/2000 | Bui | 326/83 |
| 6,205,077 B1 * | 3/2001 | Ferrant | 365/225.7 |
| 6,232,793 B1 * | 5/2001 | Arimoto et al. | 326/34 |
| 6,246,259 B1 | 6/2001 | Zaliznyak et al. | |
| 6,342,794 B1 * | 1/2002 | Turner et al. | 326/68 |
| 6,429,726 B1 * | 8/2002 | Bruneau et al. | 327/537 |
| 6,433,585 B1 * | 8/2002 | Patel et al. | 326/83 |
| 6,529,421 B1 * | 3/2003 | Marr et al. | 365/189.09 |
| 6,624,661 B2 | 9/2003 | Liu et al. | |
| 7,355,437 B2 * | 4/2008 | Perisetty | 326/14 |
| 7,501,849 B2 * | 3/2009 | Perisetty | 326/15 |
| 7,626,423 B1 * | 12/2009 | Li et al. | 326/86 |
| 2002/0140496 A1 * | 10/2002 | Keshavarzi et al. | 327/534 |
| 2007/0200596 A1 * | 8/2007 | Lee et al. | 326/41 |
| 2009/0273361 A1 * | 11/2009 | Batra et al. | 326/16 |

* cited by examiner

*Primary Examiner* — Vibol Tan
(74) *Attorney, Agent, or Firm* — Steven A. Shaw; W. James Brady; Frederick J. Telecky, Jr.

(57) ABSTRACT

An integrated circuit (IC) includes at least one programmable digital logic cell that includes first dedicated digital logic cell having a plurality of transistors including at least one PMOS transistor and at least one NMOS transistor configured to perform at least one digital logical function. The first dedicated digital logic cell includes a plurality of nodes including at least one input node and at least one output node that reflects performance of a digital logical function. Programmable tuning circuitry includes at least one tuning input and at least one tuning circuit output. Circuitry for coupling or decoupling the tuning input or tuning circuit output to at least one of the plurality of nodes of the first dedicated digital logical cell is provided, wherein the coupling or decoupling is operable to change the processing speed for the first reprogrammable digital logic cell.

20 Claims, 6 Drawing Sheets

IC HAVING PROGRAMMABLE DIGITAL LOGIC CELLS

CROSS REFERENCE TO RELATED APPLICATIONS

This application claims the benefit of Provisional Application Ser. No. 61/050,059 entitled "Design Aspects of Addressing Variability and Process Optimization", filed May 2, 2008, which is herein incorporated by reference in its entirety.

FIELD

Embodiments of the present invention generally relate to integrated circuits (ICs) including programmable logic devices (PLDs) which are configurable to reduce performance variability.

BACKGROUND

Electronics designers continually adapt their designs to account for changes in design approaches and electronics technology. One such design issue encountered is the increase of the relative process variability between nodes, such as when transitioning from 45 nm to 28 nm. This variability generally results in circuit designers adding additional margins to their designs to account for uncertainty in operational circumstances, such as spatial transistor variations, local transistor mismatch, $V_T$ skew, and interlayer interconnect variation. Designs of ICs such as digital logic circuits formed from electronically connected digital logic cells, therefore, are increasingly being affected by inherent variations in the digital logic cells, which result from IC performance affecting parameters, such as resulting from variation in manufacturing processes.

Current design approaches require designers to be aware of and account for process variations for each digital logic cell, such as the most basic standard two transistor CMOS inverter cell. Variations in the supply voltage and/or ground reference voltage result in changes in the time required for the cell to process the input signal to produce the output signal, such as indicated in its delay time (also referred to as the cell delay), rise time and fall time parameters.

Increased variations in cell delays produce a significant increase in the worst-case cell delays over the nominal delays. In some cases, the worst-case delays may be so significant that traditional logic design methods are rendered ineffective.

Further, standard logic cells are generally produced having standard drive strengths. Thus, designers generally limit and/or adjust their designs to utilize the available standard drive strengths. As used herein, the rise or fall time of a cell resulting from fabrication with a strong process is defined to be less than the rise or fall time of a cell resulting from a weak process. Changing a cell to utilize a different drive strength may result in the need for the entire cell to be redesigned and the IC refabricated with the new element, which further increases development time and resources.

Attempts to overcome this performance variation problem have generally focused on utilizing mathematical model and specially-developed algorithms to model the cell delay or other timing parameter. In the case of cell delays, for handling large worst-case delays, a statistical timing analysis methodology can be used to model the rise and fall times as random variables. The statistical models are then used by the designer to check for critical paths and close timing, rather than designing the logic to meet the worst-case rise time. Specially-developed algorithms add complexity to the solution, and, therefore, increase the time required to analyze the solution and develop the IC product.

SUMMARY

This Summary is provided to comply with 37 C.F.R. §1.73, presenting a summary of the invention to briefly indicate the nature and substance of the invention. It is submitted with the understanding that it will not be used to interpret or limit the scope or meaning of the claims.

Embodiments of the invention include methods for calibrating ICs comprising at least one programmable digital logic cell, and related ICs. Embodiments of the invention provide localized calibratable programmable digital logic cells that can address circuit performance variability, such as due to process variations, supply voltage variations, and environmental variables (e.g., temperature). As described above, programmable logic cells with 45 nanometers (nm) and smaller architectures can show a significant increase and variation in timing parameters such as cell delay (e.g., rise time and/or fall time) which can be compensated for by embodiments of the invention.

Programmable digital logic cells according to embodiments of the invention generally provide a plurality of different accessible circuit configurations, or a voltage level controller that can comprise a supply voltage or back gate voltage controller. At least one electrical performance parameter (e.g., PMOS or NMOS strength) that can affect a processing speed of the programmable digital logic cell or a parameter that can affect the electrical performance parameter (e.g., voltage supplied, or temperature) is measured to obtain calibration data using a reference device. As used herein, a "reference device" refers to a device or circuit that is not electrically coupled to the programmable digital logic cell upon which a measurement therefrom provides calibration data. The reference device may be on or off the IC. In the embodiment the reference device is off the IC, the reference device is generally a test structure on a wafer, wherein the IC and a plurality of other ICs are formed on the same wafer.

The calibration data is used to program the digital logic cell(s), such as by generating at least one control signal from the calibration data which is operable to select one of the plurality of different circuit configurations or a voltage level output by the voltage level controller. The selection implemented by the programming changes the processing speed of the programmable digital logic cell. The selection which changes the processing speed of the programmable digital logic cell can be based on, but is not limited to, changing parameters including cell delay time, rise time, fall time, duty-cycle errors and sample and hold times (e.g., for digital to analog converter ICs). Although it is generally desirable to increase processing speed, embodiments of the invention also include selecting a circuit configuration or a voltage level output to reduce the processing speed (e.g., to save power).

The programmable digital logic cells can embodied as programmable digital logic cells or reprogrammable (i.e. continuously, periodically or aperiodically) digital logic cells. In the programmable embodiment, the selective coupling circuitry is provided for selectively coupling or selectively decoupling programmable tuning circuitry to a dedicated digital logical cell.

As used herein, a "dedicated" digital logical cell is a digital logical cell that is configured, independent of the programming for the programmable digital logic cell, to provide at least one input and at least one output for the programmable digital logic circuit and to perform at least one digital logical function. The programmable tuning circuitry and selective coupling circuitry can be used to compensate for variables that can affect the processing speed of the digital logic cell, such as temperature, power supply level, and process-induced device, interconnect and/or parasitic device variations, wherein the programmable tuning circuitry provides compensation at the digital logic cell or transistor level.

The selective programming can be based on a plurality of fuses or a plurality switches. For example, the step of setting the state of the fuses (e.g., applying energy to blow certain fuses and rendering those fuses electrically open) or switches comprises the programming in this embodiment. Such programming is generally performed a single time, such as while the ICs are together with a plurality of other ICs in wafer form at wafer probe, or as packaged discrete ICs during package test. In another embodiment, the IC is integrated into an electronic assembly (e.g., an electronic product) comprising a workpiece (electronic substrate, e.g., printed circuit board) which can comprise one or more other ICs mounted on the workpiece.

In another programmable digital logic circuit embodiment, a memory circuit is provided on the IC, such as a register, which can establish enablement states for the control signals, so that the performance characteristics can be effectively fixed for the digital logic cell. Thus, when the digital logic cell is initialized, the control signals can be adjusted in accordance with the settings established in the memory, resulting in stable or "static" compensated performance characteristics for the digital logic circuit.

As described above, in the reprogrammable digital logic cell embodiment the programmable digital logic cells can be programmed and reprogrammed a plurality of times, and in one embodiment be considered to be continuously programmable during operation. In this embodiment the reprogrammable digital logic cell is operable to receive at least one control signal that modifies to the programmable tuning circuitry, which adjusts the processing speed of the reprogrammable digital logic cell, such as by changing its rise time and/or fall time to reduce cell delay.

In another embodiment, discrete programmable cells of a digital logic cell formed from programmable cells can be dynamically adjusted when the digital logic cell is operational, which will dynamically change performance characteristics of the programmable digital logic cell as desired. Thus, designing digital logic circuits using programmable digital logic cells permits designers to exert fine-grained control of the circuit's performance characteristics down to the cell/transistor level.

Numerous techniques can be used to create a programmable digital logic cells according to embodiments of the invention, including placing selectively activatable (via one or more control signals, switches and/or fuses) tuning circuitry in parallel or in series with the dedicated digital logical cell, and/or selectively adjusting supply or a reference voltage (via a control signal) supplied to the programmable digital logic cell.

DETAILED DESCRIPTION

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Embodiments of the invention provides solutions for adjusting the dynamic performance of digital logic cells to compensate for performance affecting variables, such as process variations, power supply variations or environmental variations. Tuning circuitry is added to the digital logic cell which can be selectively activated by tuning control signals. Process variations can be detected by parametric data, such as obtained at wafer probe (e.g., using test structures) at the package test level, or while in service when the IC chip is integrated into a product. For example, power supply variations or environmental variations can be sensed while the IC is in service using well known sensing devices and techniques.

Figure 1:
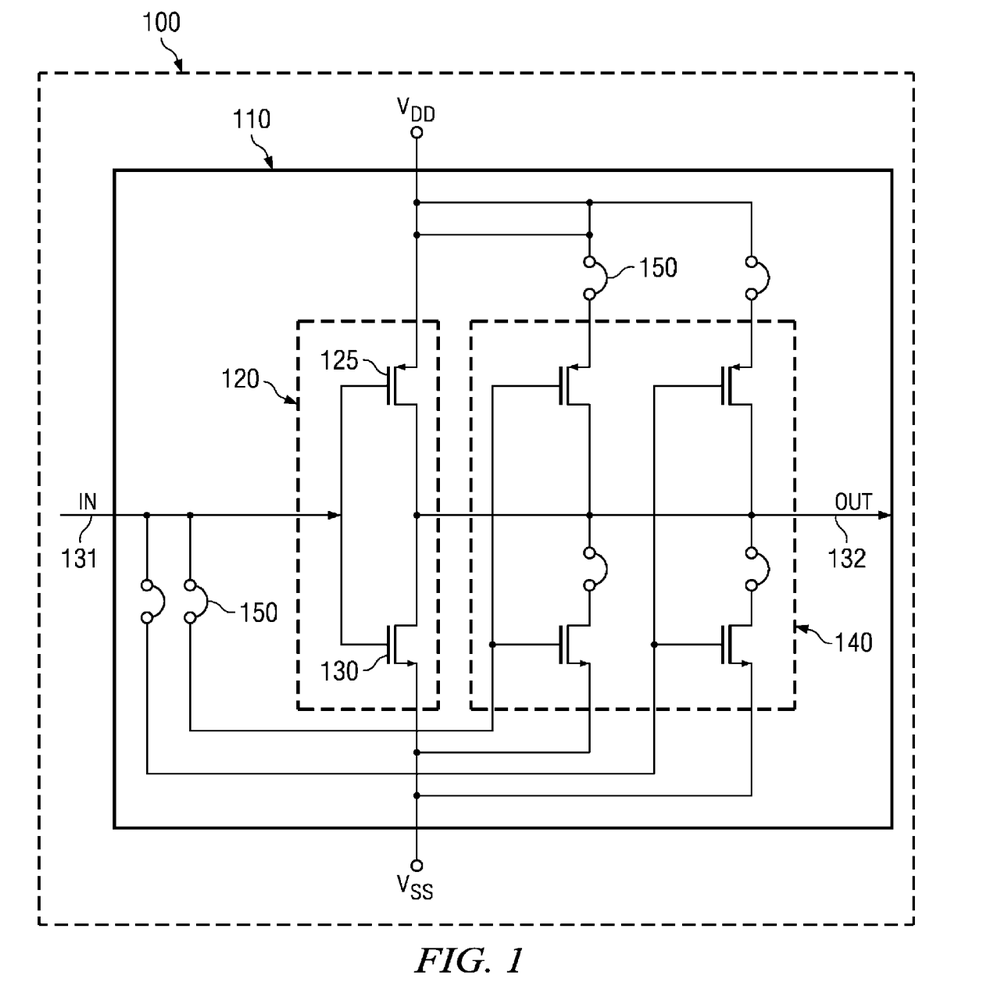
FIG. 1 is a block level schematic diagram of a CMOS IC including at least a first programmable digital logic cell that comprises a first dedicated digital logical cell, programmable tuning circuitry, and circuitry for coupling or decoupling the programmable tuning circuitry to the first dedicated digital logical cell, according to an embodiment of the invention.

FIG. 1 is a block level schematic diagram of a CMOS IC 100 including at least one programmable digital logic cell 110 referred to as first programmable digital logic cell 110 that comprises a first dedicated digital logic cell 120, programmable tuning circuitry 140, and circuitry for coupling or decoupling 150 the programmable tuning circuitry 140 to first dedicated digital logic cell 120, according to an embodiment of the invention. First dedicated digital logic cell 120 includes at least one input node 131 and at least one output node 132 that reflects performance of a digital logical function. First dedicated digital logic cell 120 is generally a standard digital logic circuit that comprises a plurality of transistors including at least one PMOS transistor 125 and at least one NMOS transistor 130 configured to perform at least one digital logical function, such as the exemplary standard CMOS inverter shown in FIG. 1. More generally, first dedicated digital logic cell 120 generally provides a Boolean logic function, such as, but not limited to, NAND, AND, OR, NOR, XOR, XNOR or an inverter function.

The first programmable digital logic cell 110 includes tuning circuitry 140 coupled by circuitry for coupling or decoupling 150 shown as fuses 150 to at least one of the plurality of nodes of the first dedicated digital logic cell 120. Tuning circuitry 140 as shown in FIG. 1 comprises a first and second inverter that are in parallel relative to first dedicated digital logic cell 120 when programmed (e.g., fuses 150 made to be electrically conductive) to both be active. The operation of first programmable digital logic cell 110 as reflected in the tuning circuit output 132 is thus different based on the programming of fuses 150, which after programming changes a processing speed for the first programmable digital logic cell 110. As noted above, fuses can generally be replaced by switches.

Generally, the processing speed (e.g., cell delay) for first programmable digital logic cell 110 with one or more of the inverters in tuning circuitry 140 programmed to be active is less than the processing speed for first programmable digital logic cell 110 without any of the inverters in tuning circuitry 140 programmed to be active (e.g., the cell delay is approximately the cell delay provided by first dedicated digital logic cell 120 alone). However, as described above, embodiments of the invention also include programming to decrease the processing speed for first programmable digital logic cell 110 as compared to the first dedicated digital logic cell 120 alone.

As known in the art, fuses, such as fuses 150 shown in FIG. 1, may be grouped into two classes, laser fuses and electrical fuses. Laser fuses are blown by a chip-external laser beam which irradiates specific fuses to supply enough energy to blow the fuses. For laser fuses, a laser beam is simply pointed at the fuses which are to be blown, that is, addressing by location. Known electrical fuses can be a wire type or a semiconductor layer type. For the wire type, a relatively low-resistive element, such as a wire, increases its resistance permanently once a high current stresses this element. The stressed wire creates an opening similar to traditional laser-fuses. For the layer type fuse, a high-resistive layer between conductive layers permanently decreases its resistance from a high voltage or consecutive current, leading to a breakdown of this layer. For example, an isolator or dielectric material which starts to break through at a certain voltage level and stays permanently damaged forming a low resistive path. Unlike laser fuses, electrical fuses are not blown solely by addressing by location. Instead, electrical fuses are blown by accessing pins of a chip or bond pads of a wafer, and in some arrangements together with electrical control signals that control addressing by location.

Figure 2:
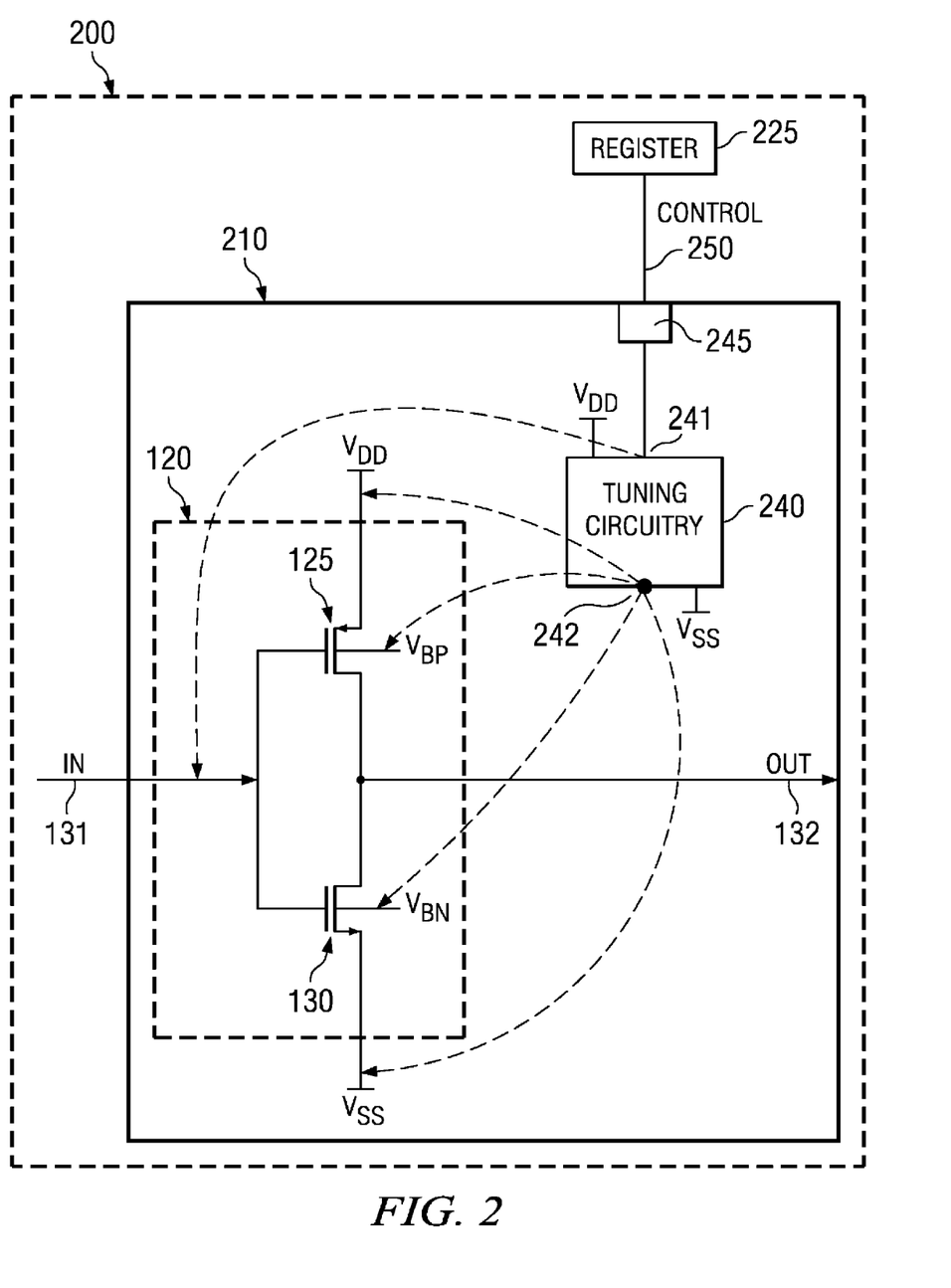
FIG. 2 is a block level schematic diagram of a CMOS IC including at least a first reprogrammable digital logic cell comprises a first dedicated digital logical cell, programmable tuning circuitry, and circuitry for coupling or decoupling the programmable tuning circuitry to the first dedicated digital logical cell, according to an embodiment of the invention.

FIG. 2 is a block level schematic diagram of a CMOS IC 200 including at least a first reprogrammable digital logic cell 210 that comprises a first dedicated digital logic cell 120, and programmable tuning circuitry 240. IC 200 includes register 225, which stores programming information which allows output of at least one control signal 250 which is used to program the programmable tuning circuitry 240. Selective coupling circuitry in the embodiment shown comprises switch(es) 245 (e.g., transistor switches) for selectively coupling or selectively decoupling the control signal(s) 250 to the programmable tuning circuitry 240, according to an embodiment of the invention.

Programmable tuning circuitry 240 is shown including at least one tuning input node 241 and at least one tuning circuit output node 242. Dashed lines show some of many possible connections between the output 242 of programmable tuning circuitry 240 and the plurality of nodes of the first dedicated digital logic cell 120, such as made possible by switched connections. In one embodiment, the tuning input node 241 receives at least one control signal 250 that is operable to select different output states reflected at tuning circuit output 242, wherein respective ones of the different output states provide a different processing speed for the first reprogrammable digital logic cell 210. In one simplified example, in one state (e.g., control signal 250 turning programmable tuning circuitry 240 off or not turning programmable tuning circuitry 240 on) first reprogrammable digital logic cell 210 can provide a weak process/corner characteristics (i.e. resulting in a slower processing speed) and in another state (control signal 250 turning tuning circuitry 240 on) first reprogrammable digital logic cell 210 can provide a strong process corner characteristics (i.e. resulting in a faster processing speed).

In one embodiment, the first reprogrammable digital logic cell 210 is implemented in a standard cell layout wherein as well known in the art, the respective transistors are formed by gate electrode (e.g., silicided polysilicon) "fingers" that cross n-diffusion stripes (PMOS) and p-diffusion stripes (NMOS). In such an embodiment, all the PMOS transistors for first dedicated digital logic cell 120 (including PMOS 125) and PMOS transistors for programmable tuning circuitry 240 are formed in a common n-stripe and all the NMOS transistors for first dedicated digital logic cell 120 (including NMOS 130) and tuning circuitry 240 are formed in a common p-stripe. As known in the art, a single finger can be used to form the common gate for the respective transistors of a standard CMOS inverter.

Figure 3A:
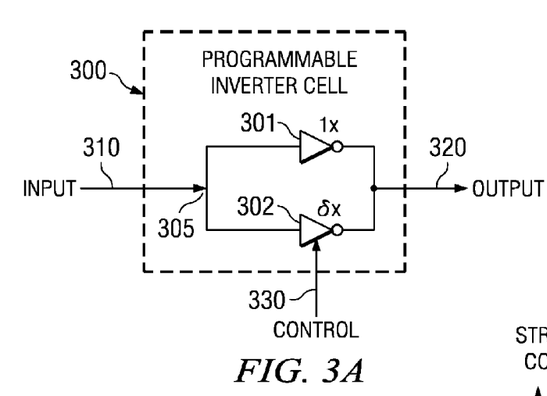
FIG. 3A is a block level schematic diagram of a programmable digital logic cell in accordance with an embodiment of the invention.

FIG. 3A is a block level schematic diagram of a programmable digital logic cell 300 in accordance with an embodiment of the invention. Programmable digital logic cell 300 comprises dedicated digital logic cell 301 and programmable tuning circuitry 302 hooked in parallel. Dedicated digital logic cell 301 is shown having a tuning strength of 1×, and programmable tuning circuitry 302 having a tuning strength of δx, where δ is a non-zero parameter, which can be >1, =1, or <1. For example, the processing performed by programmable digital logic cell 300 having programmable tuning circuitry 302 with a tuning strength of 0.5× can be increased by 0.5× (to 1.5 ×) when programmable tuning circuitry 302 is activated. The programmable digital logic cell 300 embodied as two (2) inverters is shown as a single inverter for simplifying and illustrative purposes only, and that the illustrated configurations can be utilized with a variety of other logic cells, having a variety of logic building blocks in a variety of numbers.

The programmable tuning circuitry 302 can comprise a matched digital logic cell relative to the dedicated digital logic cell 301. Generally, the geometry of the matched digital logic cell 302 is different as compared to the dedicated digital logic cell 301, as reflected in the δ parameter. As known in the art, the close proximity provided by standard cell designs (spacings on the order of 1 μm, or less, such as between transistors in programmable tuning circuitry 302 and transistors in dedicated digital logic cell 301) improves matching through doping, etching and lithographically being essentially the same.

In one embodiment, programmable digital logic is embodied as a standard cell design. Like a standard CMOS inverter, the programmable digital logic cell 300 can generate an inverted output signal 320 upon receipt of an input signal 310 at its input lead 305. Unlike a standard CMOS inverter, programmable digital logic cell 300 is a programmable cell having adjustable processing speed based on the presence or absence of, or level of, control signal 330. For example, in one state (control signal 330 off) cell 300 can have weak process/corner characteristics and in another state (control signal on) cell 300 can have strong process/corner characteristics. The presence of programmable tuning circuitry 302 can allow modifications to the programmable digital logic cell 300 without requiring additional fabrication or design changes. Thus, ICs including cell designs according to embodiments of the invention can be developed with reduced development time and cost.

Figure 3B:
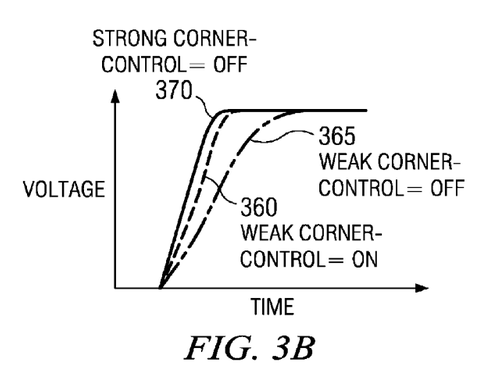
FIG. 3B is a depiction of switching characteristics for a conventional digital logic cell fabricated with a strong process corner, a dedicated digital logic cell fabricated with a weak process corner, and a programmable digital logic cell in accordance with an embodiment of the invention having a dedicated digital logic cell tuned by programmable tuning circuitry.

FIG. 3B is a depiction of switching characteristics for a conventional digital logic cell such as dedicated digital logic cell 301 fabricated with a strong process corner 370, a dedicated digital logic cell 301 fabricated with a weak process corner 365, and a programmable digital logic cell 300 according to an embodiment of the invention having dedicated digital logic cell 301 having a weak process corner tuned by programmable tuning circuitry 302 to provide a response like that from as strong process corner 370, shown as "Weak corner-Control-On" 360. The performance of programmable digital logic cell 300 in accordance with an embodiment of the invention having a dedicated digital logic cell 301 fabricated with a weak process tuned by programmable tuning circuitry 302 (response 360) can be seen to approach the switching performance of the dedicated digital logic cell 301 fabricated with a strong process corner (response 370).

Figure 4:
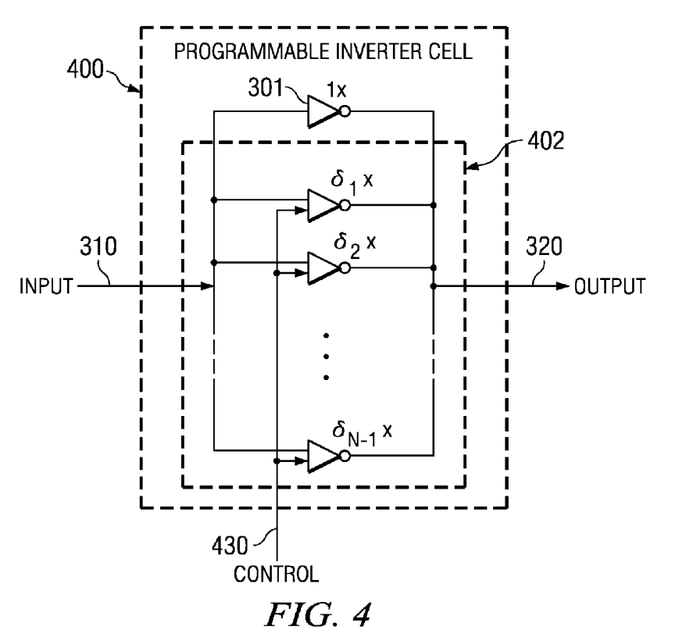
FIG. 4 is a block level schematic diagram of a programmable digital logic cell comprising a dedicated digital logic cell having programmable tuning circuitry comprising N inverter cells, in accordance with an embodiment of the invention.

FIG. 4 is a block level schematic diagram of a programmable digital logic cell 400 comprising a dedicated digital logic cell (inverter) 401 having programmable tuning circuitry 402 comprising N inverter cells, in accordance with an embodiment of the invention. Each of the N inverter cells can comprise a finger in a standard cell design. The δ parameters for the respective N inverter cells can be the same or different. In one embodiment, the δ parameters are binary weighted. Control signal is shown as 430. As noted above, the use of an inverter cell to demonstrate embodiments of the invention is for illustrative purposes only, and that embodiments of the invention can be utilized with a variety of digital logic cells, such as NAND, XOR, OR, etc.

The N elements of the programmable tuning circuitry 402 can be selectively activated by the control signal 430, such as using known addressing circuitry and methodologies. That is, different ones of the N elements of programmable tuning circuitry 402 can be activated each time the process-tuning digital inverter cell having N elements executes the process to account for dynamic operating conditions. For example, all logic tuning elements can be activated to augment a severely weak process, whereas only a single one of the N logic tuning elements may be activated for a slightly weak process, and none of the N logic tuning elements may be activated for a strong process. It is generally appropriate to only activate respective ones of the N elements to achieve the minimum tuning strength addition needed to reach the desired switching performance, since any additional tuning strength beyond the tuning strength needed to reach the desired switching performance will generally increase power dissipation and provide little performance enhancement.

In one embodiment, the N elements of programmable tuning circuitry 402 can be configured such that the N elements are centered on a nominal process strength. In the case N comprises an even quantity, the nominal process strength can activate only half of the N elements. Less than half of the logic tuning elements could be used for a strong process, and more than half of the logic tuning elements could be used for a weak process. This approach can be extended to account for N=an odd number of elements and/or balancing techniques that activate a quantity of the N elements not based on halves. For example, for N=10, the design can be configured to activate 6 logic elements to reach a desired processing speed for the cell for a nominal process strength.

Figure 5:
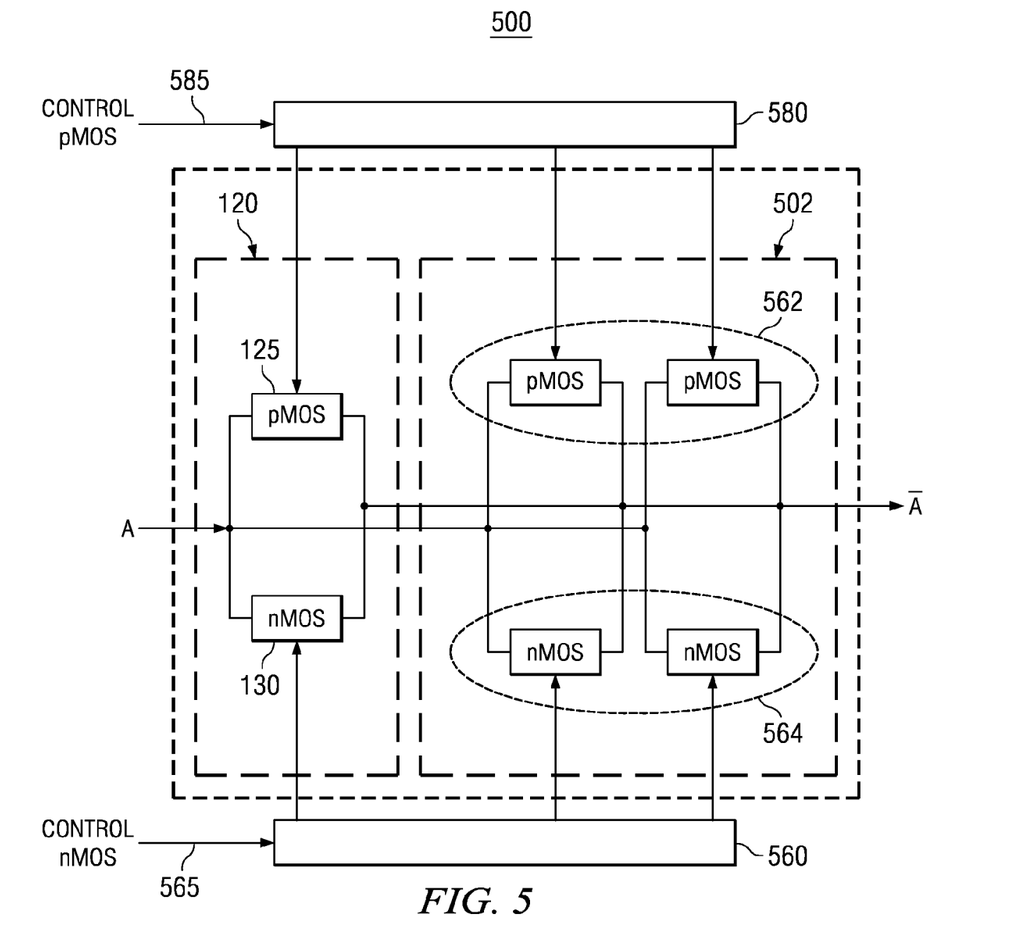
FIG. 5 is a block level schematic diagram of a programmable digital logic cell having skewing ability comprising a first digital logic cell (inverter) comprising first PMOS and first NMOS transistor, and programmable tuning circuitry comprising a plurality of additional PMOS transistors and a plurality of additional NMOS transistors, according to an embodiment of the invention.

FIG. 5 is a block level schematic diagram of a programmable digital logic cell 500 having skewing ability comprising a first dedicated digital logic cell (inverter) 120 comprising first PMOS 125 and first NMOS 130, and programmable tuning circuitry 502 comprising a plurality of additional PMOS transistors 562 and a plurality of additional NMOS transistors 564, according to an embodiment of the invention. Selective PMOS coupling circuitry 580 selectively couples a PMOS control signal 585 to at least a portion of the first PMOS transistor 125 and the plurality of additional PMOS transistors 562 and selective NMOS coupling circuitry 560 selectively couples an NMOS control signal 565 to at least a portion of the NMOS transistor 130 and the plurality of additional NMOS transistors 564. Skew as used herein refers to turning on a different number of PMOS and NMOS transistors in the programmable tuning circuitry. Hence, the technique of turning on more PMOS devices (as compared to NMOS devices) to compensate for a weak PMOS corner (or the inverse) can be generally applied to inverter cells and other digital logic cells. Independent control for activating the PMOS transistors and NMOS transistors allows for a finer level of control. For example, if the PMOS is weak and the NMOS is strong, then more PMOS transistors selected from 125, 562 will be activated by PMOS control signal 585 via selective PMOS coupling circuitry 580 to have the resulting rise time to match the fall time which is set by selected ones of the NMOS transistors 130, 564.

Figure 6:
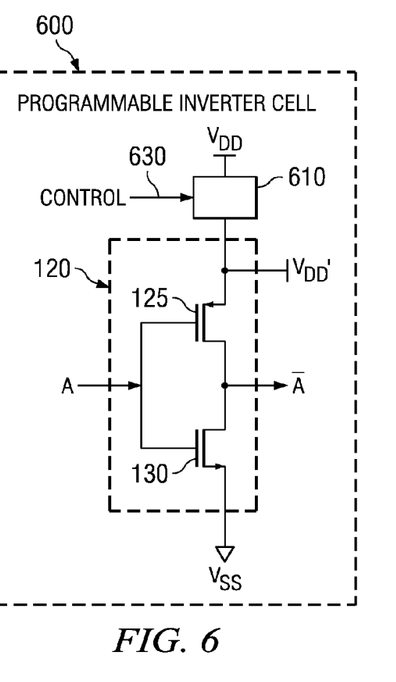
FIG. 6 is a block level schematic diagram of a programmable digital logic cell, wherein the programmable tuning circuitry comprises a voltage controller for controlling a level of VDD supplied to the first programmable digital logic cell, according to an embodiment of the invention.

FIG. 6 is a block level schematic diagram of a programmable digital logic cell 600 wherein the programmable tuning circuitry comprises a voltage controller 610 for controlling a level of VDD supplied to first dedicated digital logic cell 120, according to an embodiment of the invention. As shown in FIG. 6, voltage controller 610 receives a high supply voltage shown as VDD and based on the control signal 630 received controls the level of the VDD to provide VDD' which is supplied to the drain of PMOS 125. VDD' can be higher or lower than VDD. For example, when the process is weak, the VDD' can be >VDD to improve the processing speed of the digital logic cell (e.g., rise time). Conversely, when the process is strong, VDD' can be <VDD without degrading the processing speed of the digital logic cell. Unlike the other programmable digital logic cells described above, programmable digital logic cell 600 is configured to utilize voltage tuning to tune dynamic performance of the first dedicated digital logic cell 120, instead of using programmable tuning circuitry comprising logic tuning elements. It should be noted, however, that the embodiments of the invention include programmable digital logic cells that include voltage tuning to tune the processing speed of the programmable digital logic cell as well as tuning circuitry comprising logic tuning elements.

Figure 7:
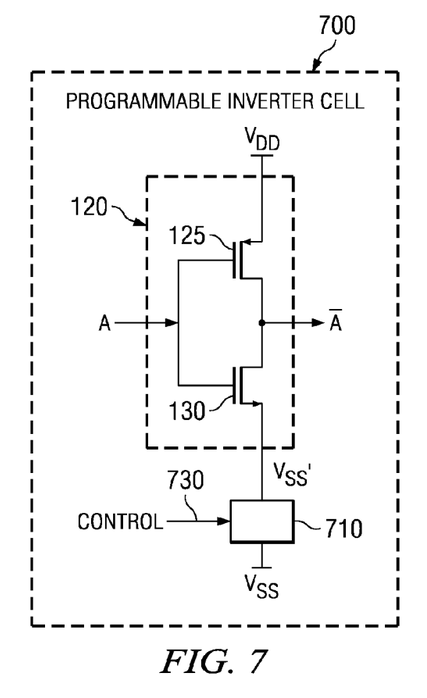
FIG. 7 is a block level schematic diagram of a programmable digital logic cell wherein the programmable tuning circuitry comprises a voltage controller for controlling a level of VSS supplied to the first programmable digital logic cell.

FIG. 7 is a block level schematic diagram of a programmable digital logic cell 700 wherein the programmable tuning circuitry comprises a voltage controller 710 for controlling a level of VSS supplied to the first programmable digital logic cell 700, according to an embodiment of the invention. As shown in FIG. 7, voltage controller 710 receives a low supply voltage shown as VSS and based on control signal 730 controls the level of VSS to provide VSS' which is supplied to the source of NMOS 130. VSS' can be higher or lower than VSS. It should be noted that the ground reference voltage is typically set according to the nominal process of the digital logic cell. However, this embodiment of the invention is not limited in this respect.

Figure 8:
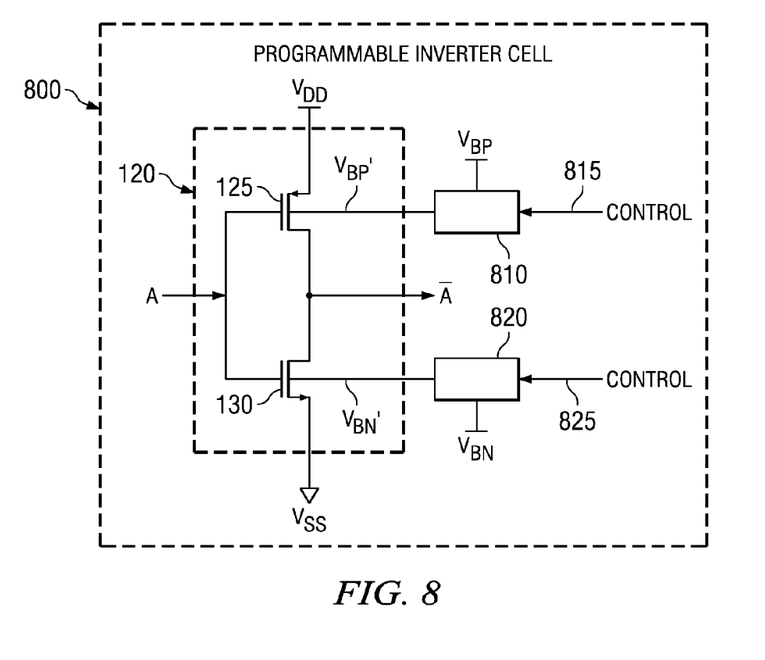
FIG. 8 is a block level schematic diagram of a programmable digital logic cell wherein the programmable tuning circuitry comprises a voltage controller for controlling a level of a back gate voltage, according to an embodiment of the invention.

FIG. 8 is a block level schematic diagram of a programmable digital logic cell 800 wherein the programmable tuning circuitry comprises a voltage controller 810 for controlling a level of a voltage supplied to a back gate (VBP) for the first PMOS transistor 125, and a voltage controller 820 for controlling a level of a voltage supplied to a back gate (VBN) for the first NMOS transistor 130, according to an embodiment of the invention. Control signal 815 is coupled to voltage controller 810 and control signal 825 is coupled to voltage controller 820. Typically, back gate voltages are tied to the source terminals of the cell (i.e. $V_{BP}=V_{DD}$ and $V_{BN}=V_{SS}$), though this embodiment of the invention is not limited in this respect. VBP' can generally be greater than, equal to or less than VBP, and VBN' can generally be greater than, equal to or less than VBN. Although the back gate voltage is shown controlled for both PMOS 125 and NMOS 130, embodiments of the invention can include controlling only one of the back gate voltage levels.

The tuning back gate voltages shown in FIG. 8 can independently adjust the performance of the PMOS 125 and NMOS transistor 130 of the inverter (or other logic element) to compensate for performance affecting variations, such as process variations. For example, when the NMOS 130 is strong and the PMOS 125 is weak, the VBP' can be set $>V_{DD}$ to make the PMOS 125 stronger. Alternately, VBN'>VSS (e.g., 0.15 volts when VSS=ground) to make NMOS 130 weaker.

Figure 9:
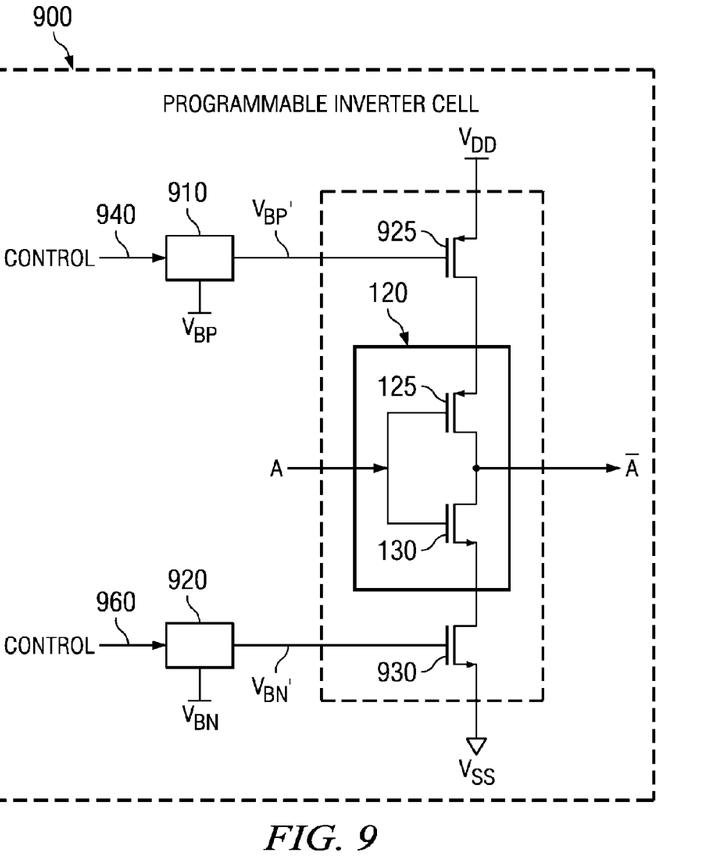
FIG. 9 is a block level schematic diagram of a programmable digital logic cell that includes programmable tuning circuitry implementing series control according to an embodiment of the invention.

FIG. 9 is a block level schematic diagram of a programmable digital logic cell 900 that includes programmable tuning circuitry implementing series control, according to an embodiment of the invention. Programmable digital logic cell 900 includes a first dedicated digital logic cell 120, and programmable tuning circuitry implementing series control comprising PMOS series pullup transistor 925 and NMOS series pulldown transistor 930. The programmable tuning circuitry also comprises a voltage controller 910 for controlling a level of a voltage supplied to a gate (VBP') for PMOS transistor 925, and a voltage controller 920 for controlling a level of a voltage supplied to the gate (VBN') for the NMOS transistor 930. Control signal 940 controls the level of VBP, shown as VDP' output by voltage controller 910, while control signal 960 controls the level of VBN, shown as VBN' output by voltage controller 920. The voltage controllers 910 and 920 can comprise circuit components capable of dynamically altering the bias voltage of the specific transistor in response to the control signals 940 and 960, respectively. Typically, bias voltages VBP' and VBN' are set to a nominal value (i.e., $V_{BPo}$ and $V_{BNo}$, respectively) for the cell's 900 nominal process, environmental or other operating conditions, though this embodiment of the invention is not limited in this respect.

This configuration including additional transistors 925 and 930 can allow the current through the first dedicated digital logic cell 120 to be independently adjusted, which, in turn, can control the processing speed of the programmable digital logic cell 900. For example, to increase the rise time for cell 900, PMOS 925 can receive a control signal 940 that decreases the bias voltage (VBP') applied to the gate of PMOS transistor 925 below its nominal value (VBP). Alternately, NMOS 930 can be receive a control signal 960 that increases the bias voltage (VBN) applied to gate of NMOS transistor 930 above its nominal value (VBN).

Figure 10:
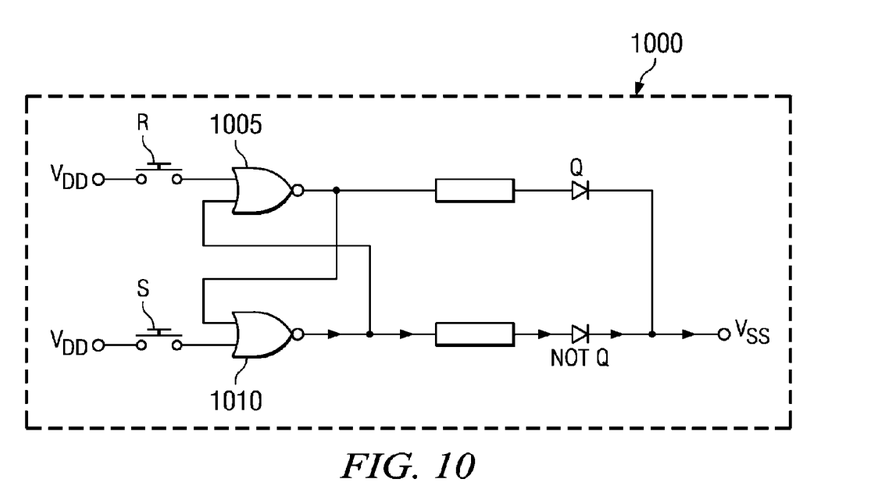
FIG. 10 shows a schematic diagram of an RS flip-flop that includes at least one programmable digital logic cell, according to an embodiment of the invention.

FIG. 10 shows a schematic diagram of an RS flip-flop 1000 that includes at least one programmable digital logic cell, according to an embodiment of the invention. The flip-flop 1200 has two inputs labeled R and S. There are also two outputs to the flip flop 1000, Q and Q-bar (shown as Not-Q). RS flip-flop 1000 is shown realized by cross coupling two NOR gates 1005 and 1010 as shown in FIG. 10. As known in the art, a 2 input NOR gates can be realized using 2 PMOS transistors and 2 NMOS transistors. Each of the NOR gates 1005 and 1010 can comprise programmable digital logic cells having programmable tuning circuitry coupled to any of the transistors, according to an embodiment of the invention.

Embodiments of the invention can be integrated into a variety of process flows to form a variety of devices and related products. Exemplary ICs include high speed digital logic, memory, mixed signal, integrated RF, digital ICs including CPUs, DSPs, GPUs, microcontrollers, digital logic used in RF, such as PLLs, sigma-delta modulators, DACs, ADCs and system clock distribution networks. The semiconductor substrates may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, the invention can be used in a variety of processes including bipolar, CMOS, BiCMOS and MEMS.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

What is claimed is:

1. An integrated circuit (IC), comprising:
   at least one programmable digital logic cell, comprising:
   a first dedicated digital logic cell comprising a plurality of transistors including at least one PMOS transistor and at least one NMOS transistor configured to perform at least one digital logical function, said first dedicated digital logic cell including a plurality of nodes including at least one input node and at least one output node that reflects performance of said digital logical function, and programmable tuning circuitry comprising:
      at least one tuning input;
      at least one tuning circuit output;
      a voltage controller for controlling a level of a voltage supplied to said programmable digital logic circuit, wherein said voltage controller is configured to control at least one of VDD or VSS for said first dedicated digital logic cell, a back gate voltage for said first PMOS transistor, and a back gate voltage for said first NMOS transistor; and
      circuitry for coupling or decoupling at least one of said tuning input and said tuning circuit output to at least one of said plurality of nodes of said first dedicated digital logical cell, said coupling or decoupling changing a processing speed for said programmable digital logic cell.

2. The IC of claim 1, wherein said circuitry for coupling or decoupling comprises a first fuse coupled to said tuning input or a second fuse coupled to said tuning circuit output.

3. The IC of claim 2, wherein said first or said second fuse comprise a laser fuse.

4. The IC of claim 2, wherein said first or said second fuse comprise an electrical fuse.

5. The IC of claim 1, wherein said circuitry for coupling or decoupling comprises a switch, said switch for selectively transmitting at least one control signal to said programmable tuning circuitry, said control signal changing a cell delay of said programmable digital logic cell.

6. The IC of claim 1, wherein said programmable tuning circuitry comprises at least one matched digital logic cell relative to said first dedicated digital logic cell configured to perform said digital logical function, said matched digital logic cell connected to said dedicated digital logic cell when said circuitry for coupling or decoupling couples said matched digital logic cell to said first dedicated digital logic cell.

7. The IC of claim 6, wherein said at least one matched digital logic cell comprises a plurality of said matched digital logic cells, wherein at least a portion of said plurality of said matched digital logic cells have at least one different drive strength as compared to a drive strength of said first dedicated digital logic cell.

8. The IC of claim 7, wherein said plurality of said matched digital logic cells provide a plurality of different levels of said drive strength.

9. The IC of claim 7, wherein said circuitry for coupling or decoupling comprises a plurality of switches each associated with respective ones of said plurality of said matched digital logic cells, said plurality of switches for selectively transmitting at least one control signal to said programmable tuning circuitry, said control signal changing said processing speed for said programmable digital logic cell.

10. The IC of claim 9, wherein said at least one control signal comprises a plurality of addressable control signals that collectively provide independent control for said plurality of said matched digital logic cells.

11. The IC of claim 1, said programmable tuning circuitry comprises a plurality of additional PMOS transistors and a plurality of additional NMOS transistors, and said circuitry for coupling or decoupling selectively couples a PMOS control signal to at least a portion of said first PMOS transistor and said plurality of additional PMOS transistors and selectively couples an NMOS control signal to at least a portion of said first NMOS transistor and said plurality of additional NMOS transistors.

12. The IC of claim 1, wherein said programmable tuning circuitry comprises a second PMOS transistor in series with a source drain path of said first PMOS transistor and a second NMOS transistor in series with a source drain path of said first NMOS transistor.

13. The IC of claim 1, wherein said programmable digital logic circuit comprises a standard cell design.

14. The IC claim 1, wherein said programmable digital logic cell comprises a flip-flop.

15. A method for calibrating an integrated circuit (IC) comprising at least one programmable digital logic cell, said programmable digital logic cell providing a plurality of different accessible circuit configurations and comprising a voltage level controller, said method comprising:
   providing calibration data for said programmable digital logic cell based on at least one electrical performance parameter that can affect a processing speed of said programmable digital logic cell;
   programming said programmable digital logic cell to select a first of said plurality of different circuit configurations based on said calibration data, wherein said programming changes said processing speed of said programmable digital logic cell; and
   controlling by said voltage level controller a level of a voltage supplied to said programmable digital logic cell.

16. The method of claim 15, wherein said programmable digital logic cell includes at least one PMOS transistor and at least one NMOS transistor, and wherein said electrical performance parameter comprises at least one of a strength parameter for said PMOS transistor and a strength parameter for NMOS transistor.

17. The method of claim 15, wherein said programmable digital logic cell comprises a first dedicated digital logical cell including a plurality of nodes including at least one input node and at least one output node that reflects performance of a digital logic function, programmable tuning circuitry comprising at least one tuning input and at least one tuning circuit output, and circuitry for coupling or decoupling at least one of said tuning input and said tuning circuit output to at least one of said plurality of nodes of said first dedicated digital logical cell, wherein said circuitry for coupling or decoupling comprises a first fuse coupled to said tuning input or a second fuse coupled to said output, and wherein said programming comprises applying energy to change a state of said first or said second fuse.

18. The method of claim 15, wherein said programmable digital logic cell comprises a first dedicated digital logical cell including a plurality of nodes including at least one input node and at least one output node that reflects performance of a digital logic function, programmable tuning circuitry comprising at least one tuning input and at least one tuning circuit output, and circuitry for coupling or decoupling at least one of said tuning input and said tuning circuit output to at least one of said plurality of nodes of said first dedicated digital logical cell, wherein said circuitry for coupling or decoupling comprises a switch, said switch for selectively transmitting at least one control signal to said programmable tuning circuitry, said control signal changing said processing speed for said programmable digital logic cell.

19. The method of claim 18, wherein said programmable tuning circuitry comprises a plurality of said matched digital logic cells relative to said first dedicated digital logic cell configured to perform said digital logical function, said plurality of matched digital logic cell being connected to said first dedicated digital logic cell when said circuitry for coupling or decoupling couples at least one of said plurality of matched digital logic cell to said first dedicated digital logic cell, wherein at least a portion of said plurality of said matched digital logic cells have a drive strength that different as compared to a drive strength of said first dedicated digital logic cell.

20. The method of claim 19, wherein said at least one control signal comprises a plurality of addressable control signals that collectively provide independent control for said plurality of said matched digital logic cells.

* * * * *